United States Patent
Feng et al.

(10) Patent No.: US 11,087,709 B2
(45) Date of Patent: Aug. 10, 2021

(54) SHIFT REGISTER AND DRIVING METHOD THEREFOR, GATE DRIVING CIRCUIT AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Silin Feng, Beijing (CN); Hongmin Li, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/643,059

(22) PCT Filed: Nov. 12, 2018

(86) PCT No.: PCT/CN2018/115024
§ 371 (c)(1),
(2) Date: Feb. 28, 2020

(87) PCT Pub. No.: WO2019/179134
PCT Pub. Date: Sep. 26, 2019

(65) Prior Publication Data
US 2020/0335056 A1    Oct. 22, 2020

(30) Foreign Application Priority Data

Mar. 19, 2018 (CN) .......................... 201810226277.4

(51) Int. Cl.
*G09G 3/36* (2006.01)
(52) U.S. Cl.
CPC ... *G09G 3/3688* (2013.01); *G09G 2310/0286* (2013.01); *G09G 2310/08* (2013.01)

(58) Field of Classification Search
CPC .................... G09G 3/3688; G09G 2310/0286
See application file for complete search history.

(56) References Cited

U.S. PATENT DOCUMENTS

| 2016/0049128 A1* | 2/2016 | Shao | ...................... G11C 19/28 345/204 |
| 2016/0275902 A1* | 9/2016 | Xue | ...................... G09G 3/3266 |

(Continued)

FOREIGN PATENT DOCUMENTS

| CN | 104766586 A | 7/2015 |
| CN | 104952409 A | 9/2015 |

(Continued)

OTHER PUBLICATIONS

First Office Action issued in corresponding Chinese Application No. 201810226277.4, dated Mar. 5, 2020, with English language translation.

*Primary Examiner* — Chun-Nan Lin
(74) *Attorney, Agent, or Firm* — McDermott Will and Emery LLP

(57) ABSTRACT

A shift register includes a first input sub-circuit, a first output sub-circuit, and a second output sub-circuit. The first input sub-circuit is connected to a first input terminal, a pull-up node, and a first control terminal, and the first input sub-circuit is configured to output a voltage of the first control terminal to the pull-up node under control of a voltage of the first input terminal. The first output sub-circuit is connected to the pull-up node, a clock signal terminal, and an output terminal, and the first output sub-circuit is configured to output a first level of the clock signal terminal to the output terminal under control of a voltage of the pull-up node. The second output sub-circuit is connected to the output terminal, a second output control terminal, and a first voltage terminal, and the second output sub-circuit is configured to (Continued)

output a voltage of the first voltage terminal to the output terminal under control of a voltage of the second output control terminal.

12 Claims, 8 Drawing Sheets

(56) References Cited

U.S. PATENT DOCUMENTS

| | | | | |
|---|---|---|---|---|
| 2016/0322115 A1* | 11/2016 | Xu | .......................... | G11C 19/28 |
| 2017/0011699 A1* | 1/2017 | Wang | ...................... | G11C 19/28 |
| 2018/0190227 A1* | 7/2018 | Feng | ...................... | G11C 19/28 |

FOREIGN PATENT DOCUMENTS

| | | |
|---|---|---|
| CN | 105895045 A | 8/2016 |
| CN | 106531120 A | 3/2017 |
| CN | 107464521 A | 12/2017 |
| CN | 108428469 A | 8/2018 |

* cited by examiner

SHIFT REGISTER AND DRIVING METHOD THEREFOR, GATE DRIVING CIRCUIT AND DISPLAY DEVICE

CROSS-REFERENCE TO RELATED APPLICATIONS

This application is a national phase entry under 35 USC 371 of International Patent Application No. PCT/CN2018/115024 filed on Nov. 12, 2018, which claims priority to Chinese Patent Application No, 201810226277.4, filed with the Chinese Patent Office on Mar. 19, 2018, titled "SHIFT REGISTER UNIT AND DRIVING METHOD THEREFOR, GATE DRIVING CIRCUIT AND DISPLAY DEVICE", which are incorporated herein by reference in their entirety.

TECHNICAL FIELD

The present disclosure relates to the field of display technologies, and in particular, to a shift register and a driving method therefor, a gate driving circuit, and a display device.

BACKGROUND

In a display device, for example, a liquid crystal display (LCD) device, due to the existence of parasitic capacitance and RC delay on a gate line, a waveform of a pixel electrode at a proximal end is different from a waveform of a pixel electrode at a distal end.

SUMMARY

Some embodiments of the present disclosure provide a shift register, which includes a first input sub-circuit, a first output sub-circuit, and a second output sub-circuit. The first input sub-circuit is connected to a first input terminal, a pull-up node, and a first control terminal, and the first input sub-circuit is configured to output a voltage of the first control terminal to the pull-up node under control of a voltage of the first input terminal. The first output sub-circuit is connected to the pull-up node, a clock signal terminal, and an output terminal, and the first output sub-circuit is configured to output a first level of the clock signal terminal to the output terminal under control of a voltage of the pull-up node. The second output sub-circuit is connected to the output terminal, a second output control terminal, and a first voltage terminal, and the second output sub-circuit is configured to output a voltage of the first voltage terminal to the output terminal under control of a voltage of the second output control terminal.

In some embodiments, the second output sub-circuit includes a first transistor. A gate of the first transistor is connected to the second output control terminal, a first electrode of the first transistor is connected to the output terminal, and a second electrode of the first transistor is connected to the first voltage terminal.

In some embodiments, the second output sub-circuit is further connected to the pull-up node. The second output sub-circuit further includes a second transistor. A gate of the second transistor is connected to the second output control terminal, a first electrode of the second transistor is connected to the pull-up node, and a second electrode of the second transistor is connected to the first voltage terminal.

In some embodiments, the first input sub-circuit includes a third transistor. A gate of the third transistor is connected to the first input terminal, a first electrode of the third transistor is connected to the first control terminal, and a second electrode of the third transistor is connected to the pull-up node.

In some embodiments, the first output sub-circuit includes a fourth transistor and a first capacitor. A gate of the fourth transistor is connected to the pull-up node, a first electrode of the fourth transistor is connected to the clock signal terminal, and a second electrode of the fourth transistor is connected to the output terminal. A first electrode of the first capacitor is connected to the pull-up node, and a second electrode of the first capacitor is connected to the output terminal. A width-to-length ratio of the first transistor is greater than a width-to-length ratio of the fourth transistor.

In some embodiments, the shift register further includes a pull-down control sub-circuit and a pull-down sub-circuit. The pull-down control sub-circuit is connected to the pull-up node, a second voltage terminal, a third voltage terminal, and a pull-down node. The pull-down control sub-circuit is configured to output a voltage of the third voltage terminal to the pull-down node under control of the voltage of the pull-up node. The pull-down control circuit is further configured to output a voltage of the second voltage terminal to the pull-down node under control of the voltage of the second voltage terminal. The pull-down sub-circuit is connected to the pull-down node, the pull-up node, the third voltage terminal, and the output terminal. The pull-down sub-circuit is configured to pull down potentials at the pull-up node and at the output terminal to the voltage of the third voltage terminal under control of a voltage of the pull-down node.

In some embodiments, the pull-down control sub-circuit includes a fifth transistor, a sixth transistor, a seventh transistor and an eighth transistor. A gate and a first electrode of the fifth transistor is connected to the second voltage terminal, and a second electrode of the fifth transistor is connected to a first electrode of the seventh transistor. A gate of the sixth transistor is connected to the pull-up node, a first electrode of the sixth transistor is connected to the second voltage terminal, and a second electrode of the sixth transistor is connected to the pull-down node. A gate of the seventh transistor is connected to the pull-up node, and a second electrode of the seventh transistor is connected to the third voltage terminal. A gate of the eighth transistor is connected to the pull-up node, a first electrode of the eighth transistor is connected to the pull-down node, and a second electrode of the eighth transistor is connected to the third voltage terminal.

In some embodiments, the pull-down sub-circuit includes a ninth transistor and a tenth transistor. A gate of the ninth transistor is connected to the pull-down node, a first electrode of the ninth transistor is connected to the pull-up node, and a second electrode of the ninth transistor is connected to the third voltage terminal. A gate of the ninth transistor is connected to the pull-down node, a first electrode of the ninth transistor is connected to the output terminal, and a second electrode of the ninth transistor is connected to the third voltage terminal.

In some embodiments, the shift register further includes a second input sub-circuit. The second input sub-circuit is connected to a second input terminal, the pull-up node, and a second control terminal, and the second input sub-circuit is configured to output a voltage of the second control terminal to the pull-up node under control of a voltage of the second input terminal.

In some embodiments, the second input sub-circuit includes an eleventh transistor. A gate of the eleventh transistor is connected to the second input terminal, a first electrode of the eleventh transistor is connected to the pull-up node, and a second electrode of the eleventh transistor is connected to the second control terminal.

In some embodiments, in a case where the shift register includes the first transistor to a eleventh transistor, the first transistor to the eleventh transistor are all N-type transistors or P-type transistors.

Some embodiments of the present disclosure provide a driving method for the shift register as described in the first aspect. The driving method includes: in an input period, outputting, by the first input sub-circuit; the voltage of the first control terminal to the pull-up node under control of the voltage of the first input terminal; in a first output period, outputting, by the first output sub-circuit, the first level of the clock signal terminal to the output terminal under control of the voltage of the pull-up node; and in a second output period, outputting, by the second output sub-circuit, the voltage of the first voltage terminal to the output terminal under control of the voltage of the second output control terminal. An absolute value of the voltage of the first voltage terminal is less than an absolute value of the first level of the clock signal terminal.

Some embodiments of the present disclosure provide a gate driving circuit; which includes a plurality of shift registers as described in the first aspect connected in cascade. A first input terminal of a first-stage shift register is connected to a start signal terminal, and an output terminal of a previous-stage shift register except for the first-stage shift register is connected to a first input terminal of a next-stage shift register.

Some embodiments of the present disclosure provide a display device, which includes the gate driving circuit as described in the third aspect.

In some embodiments, each gate driving circuit includes a second input sub-circuit, a second input terminal of a shift register in each stage except for a last-stage shift register is connected to an output terminal of a next-stage shift register, and a second input terminal of the last-stage shift register is connected to a second signal terminal.

BRIEF DESCRIPTION OF THE DRAWINGS

In order to describe technical solutions in embodiments of the present disclosure and in the related art more clearly, the accompanying drawings to be used in the description of embodiments and the related art will be introduced briefly below. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
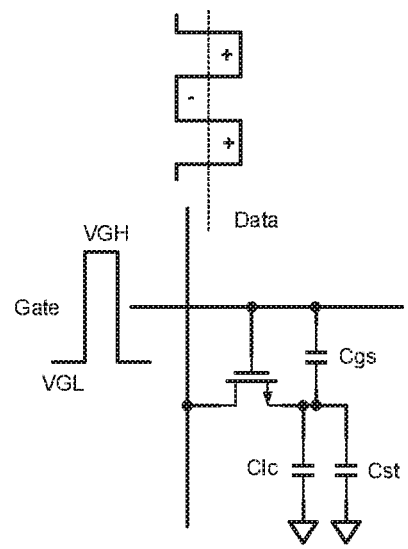
FIG. 1 is an equivalent circuit diagram of a pixel in a liquid crystal display screen in the related art.

In a display device in the related art, referring to FIG. 1, an equivalent circuit diagram of a pixel in a liquid crystal display (LCD) screen is shown, in which Clc indicates a liquid crystal capacitor, Cst indicates a storage capacitor, and Cgs indicates a parasitic capacitor of a thin film transistor (TFT).

Due to existence of the parasitic capacitor Cgs of the TFT, there will be a feedthrough effect on a pixel voltage. When a level of a driving signal of a gate line (Gate) is lowered from a high level VGH to a low level VGL to turn off the TFT, electric charges on Cst, Cst, and Cgs will be redistributed, and the pixel voltage Vp will include a feedthrough voltage ΔVp. According to the law of conservation of charge, it may be obtained that:

$$\Delta Vp = \frac{Cgs}{Cgs - Clc - Cst}\Delta Vg,$$

where $\Delta Vg=(V_{GL}-V_{GH})$ is a voltage of the low level VGL (i.e., a low voltage), and $V_{GH}$ is a voltage of the high level VGH (i.e., a high voltage).

Figure 2:
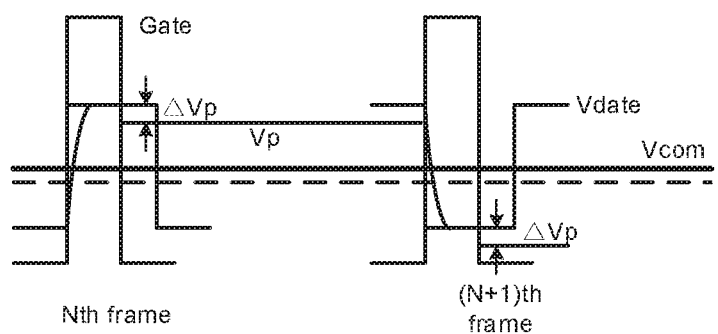
FIG. 2 is a waveform diagram of voltages of two adjacent image frames in an ideal state.

As shown in FIG. 2, data signals Vdate on a pixel electrode in two adjacent image frames have opposite polarities, and due to existence of the feedthrough voltage ΔVp, values of which are negative and equal, ideally, it is possible to make data voltages Vdate symmetric about a common voltage Vcom just by shifting the common voltage Vcom down by an absolute value of ΔVp.

Figure 3:
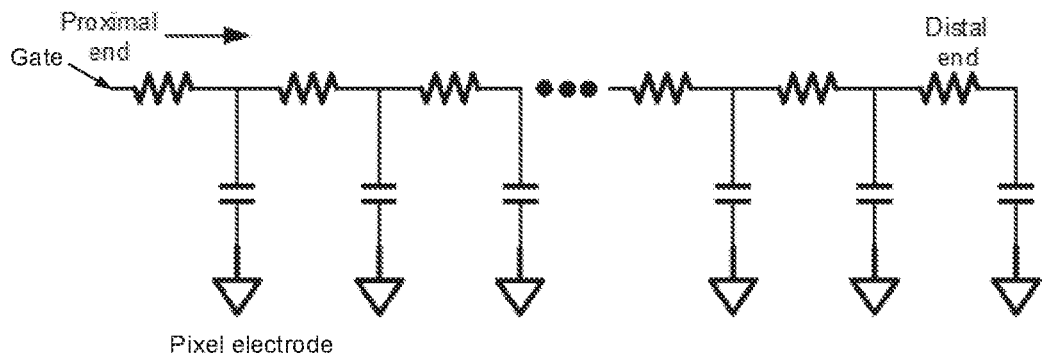
FIG. 3 is an equivalent circuit diagram of a RC Delay on a gate line in the related art.
Figure 4:
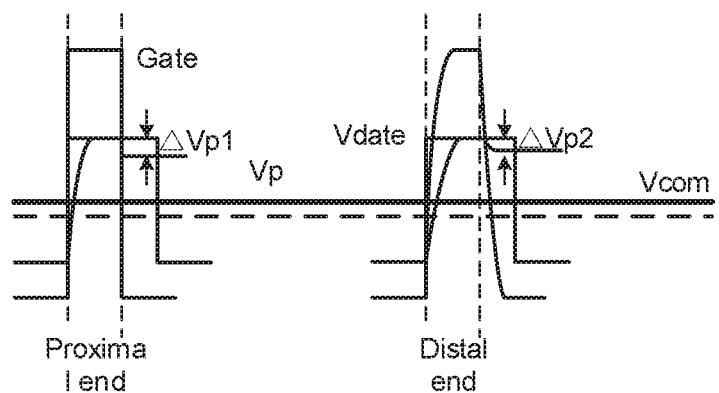
FIG. 4 is a schematic diagram showing waveforms of voltages at a proximal end and at a distal end of a gate line in the related art.

However, in practical applications, there is impedance on the gate line itself, and there is a large amount of capacitive reactance on the gate line and the pixel electrode. As shown in FIG. 3, an equivalent circuit of pixels located in a same row is a classic RC delay circuit. As shown in FIG. 4, due to existence of resistors and a capacitors (RC delay) on the gate line, waveforms of pixel voltages at a proximal end and at a distal end are different.

At the proximal end, since the RC Delay has a very small influence, during transformation between high and low levels (Von/Voff), a gate line driving voltage is immediately changed from $V_{GH}$ to $V_{GL}$, and the TFT is turned off. In this case, the feedthrough voltage at the proximal end is: $\Delta Vg1=V_{GL}-V_{GH}$. At the distal end, due to an influence of the RC delay, the gate line driving voltage reaches $V_{GL}$ after a certain delay when the driving voltage is changed from $V_{GH}$ to $V_{GL}$. That is, the TFT is not immediately turned off when the driving voltage is changed from the high level to the low level. In this case, the feedthrough voltage at the distal end is: $\Delta Vg2=V_{GL}-V_{GH}'$. A high level at the distal end $V_{GH}'$ is less than a high level at the proximal end $V_{GH}$ due to existence of the resistances on the gate line.

Therefore, since the feedthrough effect affects the proximal end and the distal end differently, feedthrough voltages $\Delta Vp$ at the proximal end and at the distal end are also different. Consequently, it is unable to make the data voltages Vdate at the proximal end and at the distal end be symmetric about the common voltage Vcom by individually adjusting the common voltage Vcom to a certain value. In this case, voltages on liquid crystal capacitors in some regions of a LCD panel will not be symmetric about the common voltage Vcom. Therefore, rotation angles of liquid crystal molecules will be different, and light passing through the liquid crystal molecules will be different, which will cause flickering during display and affect display quality of images.

Figure 5:
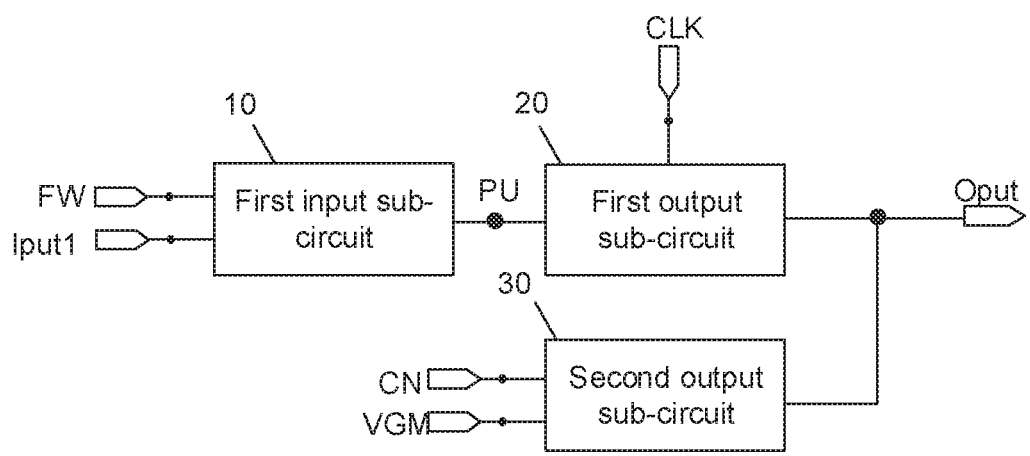
FIG. 5 is a diagram showing sub-circuits of a shift register according to some embodiments of the present disclosure.

Embodiments of the present disclosure provide a shift register. As shown in FIG. 5, the shift register includes a first input sub-circuit 10, a first output sub-circuit 20, and a second output sub-circuit 30.

The first input sub-circuit 10 is connected to a first input terminal INPUT1 (hereinafter and in the drawings indicated by "Iput1"), a pull-up node PU, and a first control terminal FW. The first input sub-circuit 10 is configured to output a voltage of the first control terminal FW to the pull-up node PU under control of a voltage of the first input terminal Iput1.

The first output sub-circuit 20 is connected to the pull-up node PU, a clock signal terminal CLK, and an output terminal OUTPUT (hereinafter and in the drawings indicated by "Oput"). The first output sub-circuit 20 is configured to output a first level of the clock signal terminal CLK to the output terminal Oput under control of a voltage of the pull-up node PU in a first output period of the shift register.

The second output sub-circuit 30 is connected to the output terminal Oput, a second output control terminal ON, and a first voltage terminal VGM. The second output sub-circuit 30 is configured to output a voltage of the first voltage terminal VGM to the output terminal Oput under control of a voltage of the second output control terminal CN in a second output period of the shift register. An absolute value of the voltage of the first voltage terminal VGM is less than an absolute value of the first level of the clock signal terminal CLK.

It will be noted that, as for the above description that "an absolute value of the voltage of the first voltage terminal VGM is less than an absolute value of the first level of the clock signal terminal CLK", a person skilled in the art should know that a signal of the clock signal terminal CLK is usually a periodic square-wave signal including a high level VGH and a low level VGL. Here, one of the high level VGH and the low level VGL is used as the first level, and another is used as a second level. In some embodiments of the present disclosure where transistors of the shift register are N-type transistors, the high level VGH is used as the first level, and the low level VGL is used as the second level. In this case, the voltage of the first voltage terminal VGM (high level) may be set to be less than the high level VGH of the clock signal terminal CLK. In some other embodiments where transistors of the shift register are P-type transistors, the low level VGL is used as the first level and the high level VGH is used as the second level. In this case, the voltage of the first voltage terminal VGM (low level) may be set to be greater than the low level VGL of the clock signal terminal CLK.

All the following embodiments of the present disclosure are illustrated by taking an example in which the high level VGH is used as the first level, the low level VGL is used as the second level, and the voltage of the first voltage terminal VGM is less than the high level VGH of the clock signal terminal CLK. Moreover, in some embodiments of the present disclosure, the voltage of the first voltage terminal VGM is not limited, as long as the voltage $V_{GH}$ of the high level VGH of the clock signal terminal CLK is greater than the voltage $V_{GM}$ of the first voltage terminal VGM, i.e., $V_{GM}<V_{GH}$. In this way, an amount of change of a gate line driving voltage at the proximal end during transformation between high and low levels may be reduced.

Some embodiments of the present disclosure provide a shift register. In an input period, the first input sub-circuit 10 outputs the voltage of the first control terminal FW to the pull-up node PU under control of the first input terminal Iput1. In the first output period, the first output sub-circuit 20 outputs the high level VGH (the first level) of the clock signal terminal CLK to the output terminal Oput under control of the voltage of the pull-up node PU. In the second output period, the second output sub-circuit 30 outputs the voltage of the first voltage terminal VGM to the output terminal Oput under control of the voltage of the second output control terminal ON. The voltage of the first voltage terminal VGM is less than the high level VGH of the clock signal terminal CLK. That is, in the second output period, the gate line driving voltage is lowered from the high level VGH to the voltage of the first voltage terminal VGM.

Figure 6:
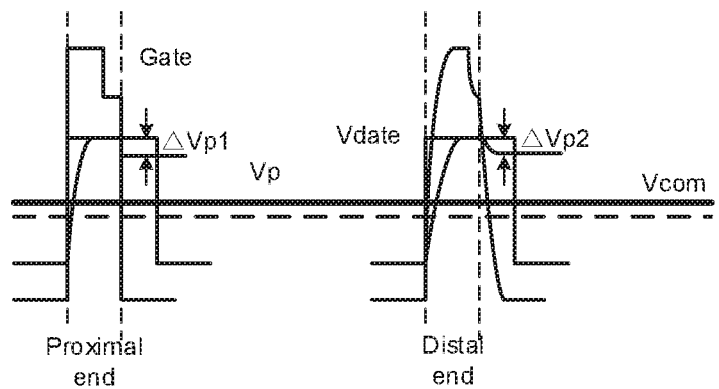
FIG. 6 is a schematic diagram showing waveforms of voltages at proximal and distal ends of a gate line connected to an output terminal of the shift register shown in FIG. 5.

On this basis, during transformation between high and low levels, in a case where the gate line is driven by the shift register provided in this embodiment, the amount of change of the gate line driving voltage at the proximal end is: $\Delta Vg1=V_{GL}-V_{GM}$. However, in a case where the gate line is driven by a related shift register, the amount of change of the gate line driving voltage at the proximal end is: $\Delta Vg1'=V_{GL}-V_{GH}$. Since the voltage of the first voltage terminal VGM is less than the high level VGH of the clock signal terminal CLK, $\Delta Vg1<\Delta Vg1'$. On this basis, in this embodiment, by reducing a difference between the amount of change $\Delta Vg_1$ of the gate line driving voltage at the proximal end and the amount of change $\Delta Vg_2$ of the gate line driving voltage at the distal end, a difference between the feedthrough voltage $\Delta Vp_1$ at the proximal end and the feedthrough voltage $\Delta Vp_2$ at the distal end may be reduced. Therefore, as shown in FIG. 6, the common voltage Vcom may be individually adjusted to a certain value, so that the data voltages Vdate at the proximal end and at the distal end are approximately symmetric about the common voltage Vcom. In this way, it may be possible to make voltages on the liquid crystal capacitors in the LCD panel symmetric about the common voltage Vcom; the problem of flickering during display due to the different rotation angles of the liquid crystal molecules may be avoided; and the display quality of the LCD panel may be improved.

In combination with the foregoing description, the shift register provided in some embodiments of the present disclosure outputs a first voltage (the high level VGH of the clock signal terminal CLK) and a second voltage (the voltage of the first voltage terminal VGM) to a gate line connected to the shift register in an output period of the gate line in a time-share manner. In this case, the shift register has a Multi-Level Gate (MLG) function.

In addition, the shift register provided in some embodiments of the present disclosure is even more effective in reducing the difference between the feedthrough voltages ΔVp at the proximal end and at the distal end of the gate line in large-sized display panels caused by RC delay.

Figure 7:
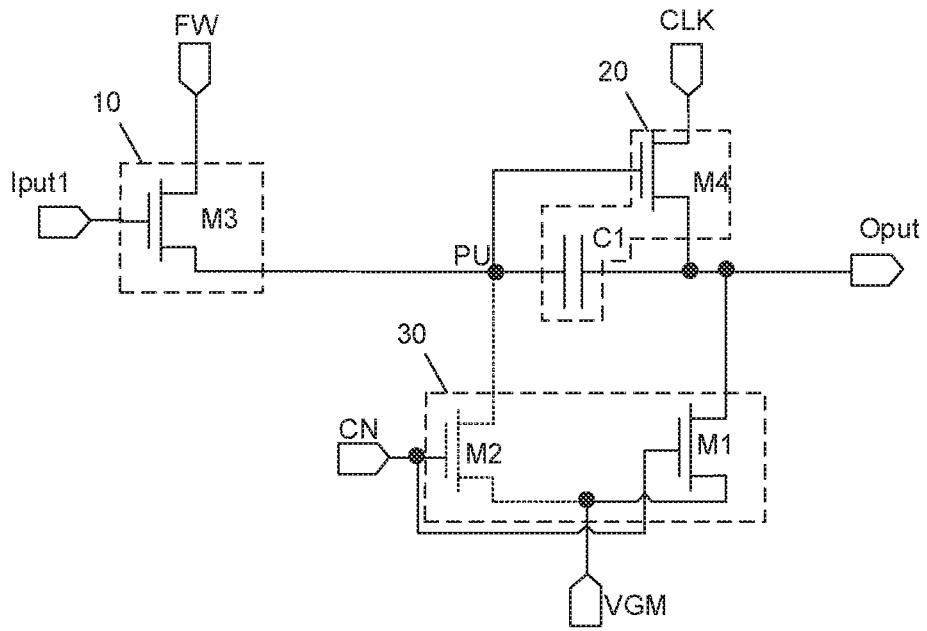
FIG. 7 is a circuit diagram of the shift register shown in FIG. 5.
Figure 9:
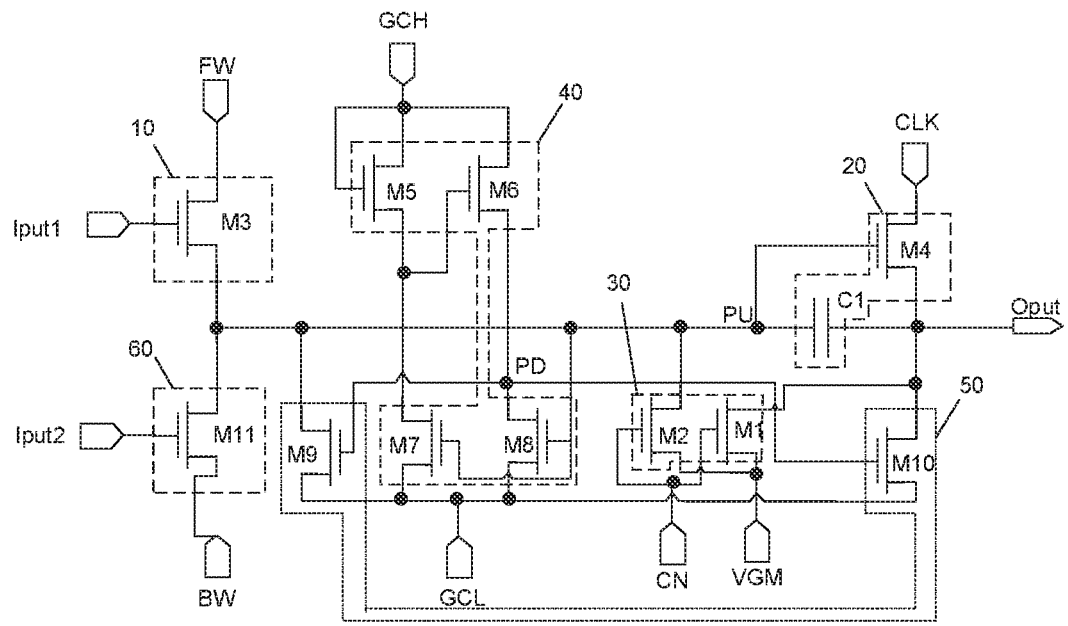
FIG. 9 is a circuit diagram of the shift register shown in FIG. 8.

It will be noted that, in some embodiments of the present disclosure, an Xth transistor is not limited to one transistor, and it may be provided as a plurality of transistors connected in series. FIGS. 7 and 9 are shown by taking an example in which the Xth transistor includes only one transistor. In some embodiments of the present disclosure, the transistors may be of a same type. For example, the transistors may all be P-type transistors or N-type transistors.

A circuit structure of the shift register provided in some embodiments of the present disclosure will be illustrated below with reference to FIG. 7. Details are as follows.

The first input sub-circuit 10 includes a third transistor M3. The third transistor M3 includes a gate, a first electrode and a second electrode. The gate of the third transistor M3 is connected to the first input terminal Iput1, the first electrode of the third transistor M3 is connected to the first control terminal FW, and the second electrode of the third transistor M3 is connected to the pull-up node PU.

The first output sub-circuit 20 includes a fourth transistor M4 and a first capacitor C1 The fourth transistor M4 includes a gate, a first electrode and a second electrode. The gate of the fourth transistor M4 is connected to the pull-up node PU, the first electrode of the fourth transistor M4 is connected to the clock signal terminal CLK, and the second electrode of the fourth transistor M4 is connected to the output terminal Oput. The first capacitor C1 includes a first electrode and a second electrode. The first electrode of the first capacitor C1 is connected to the pull-up node PU, and the second electrode of the first capacitor C1 is connected to the output terminal Oput.

The second output sub-circuit 30 includes a first transistor M1. The first transistor M1 includes a gate, a first electrode, and a second electrode. The gate of the first transistor M1 is connected to the second output control terminal ON, the first electrode of the first transistor M1 is connected to the output terminal Oput, and the second electrode of the first transistor M1 is connected to the first voltage terminal VGM.

On this basis, a working process of the shift register shown in FIG. 7 will be illustrated. An image frame includes the following periods.

In the input period, Iput1=1, CLK=0, PU=1, FW=1, and ON=0. Herein, "1" indicates high level, and "0" indicates low level.

Since the first input terminal Iput1 outputs a high level, the third transistor M3 is turned on, and transmits the high level of the first control terminal FW to the pull-up node PU to charge the first capacitor C1. Under control of the voltage of the pull-up node PU, the fourth transistor M4 is turned on, and transmits the low level of the clock signal terminal CLK to the output terminal Oput. In the input period, the output terminal Oput does not output a valid gate scanning signal. In addition, under control of the voltage of the second output control terminal ON, the first transistor M1 is turned off.

In the first output period: Iput1=0, CLK=1, PU=1, FW=1, and ON=0.

Since the first input terminal Iput1 outputs a low level, the third transistor M3 is turned off. The first capacitor C1 charges the pull-up node PU with the high level stored in the input period, so that the fourth transistor M4 remains in a turned-on state. In this case, the high level VGH of the clock signal terminal M4 is output as a valid gate scanning signal to the output terminal Oput through the fourth transistor M4, so as to scan the gate line connected to the output terminal Oput.

In addition, in the first output period, a potential at the pull-up node PU is further increased under a bootstrap action of the first capacitor C1. Under control of the voltage of the second output control terminal ON, the first transistor M1 is turned off.

In the second output period: Iput1=0, CLK=1 PU=1, FW=1, and ON=1.

Since the first input terminal Iput1 outputs a low level, the third transistor M3 is turned off. The pull-up node PU remains at a high level, and thus the fourth transistor M4 remains in the turned-on state. The high level of the clock signal terminal CLK is output to the output terminal Oput. Under control of the second output control terminal ON, the first transistor M1 is turned on, and the voltage of the first voltage terminal VGM is output to the output terminal Oput. By controlling a size ratio (that is, a channel width-to-length ratio) of the fourth transistor M4 and a size ratio of the first transistor M1 (for example, by setting a width-to-length ratio of the first transistor M1 to be greater than a width-to-length ratio of the fourth transistor M4), it may be possible to ensure that the output voltage of the output terminal Oput in this period is the voltage of the first voltage terminal VGM.

On this basis, in order to further ensure that the output terminal Oput outputs the voltage of the first voltage terminal VGM in the second output period, in some embodiments, as shown in FIG. 7, the second output sub-circuit 30 is further connected to the pull-up node PU. The second output sub-circuit 30 further includes a second transistor M2. The second transistor M2 includes a gate, a first electrode, and a second electrode. The gate of the second transistor M2 is connected to the second output control terminal ON, the first electrode of the second transistor M2 is connected to the pull-up node PU, and the second electrode of the second transistor M2 is connected to the first voltage terminal VGM.

In this case, in the second output period, under control of the voltage of the second output control terminal ON, second transistor M2 is turned on, and transmits the voltage of the first voltage terminal VGM to the pull-up node PU. Therefore, under control of the pull-up node PU, the fourth transistor M4 may not be fully turned on, and the high level UGH of the clock signal terminal CLK may not be fully transmitted to the output terminal Oput through the fourth transistor M4. As a result, it may be further ensured that the output voltage of the output terminal Oput is the voltage of the first voltage terminal VGM.

Some embodiments of the present disclosure are described by taking an example in which all transistors are N-type transistors, a DC high voltage signal output from a second voltage terminal GCH is a high level VGH that turns on the transistor, and a DC low voltage signal is output via a third voltage terminal GCL. A level of an output voltage of the first voltage terminal VGM is a high level, but the high level is smaller than the high level VGH in other voltage signals, for example, the high level VGH of the clock signal terminal CLK, and the high level VGH output from the second voltage terminal GCH.

Figure 8:
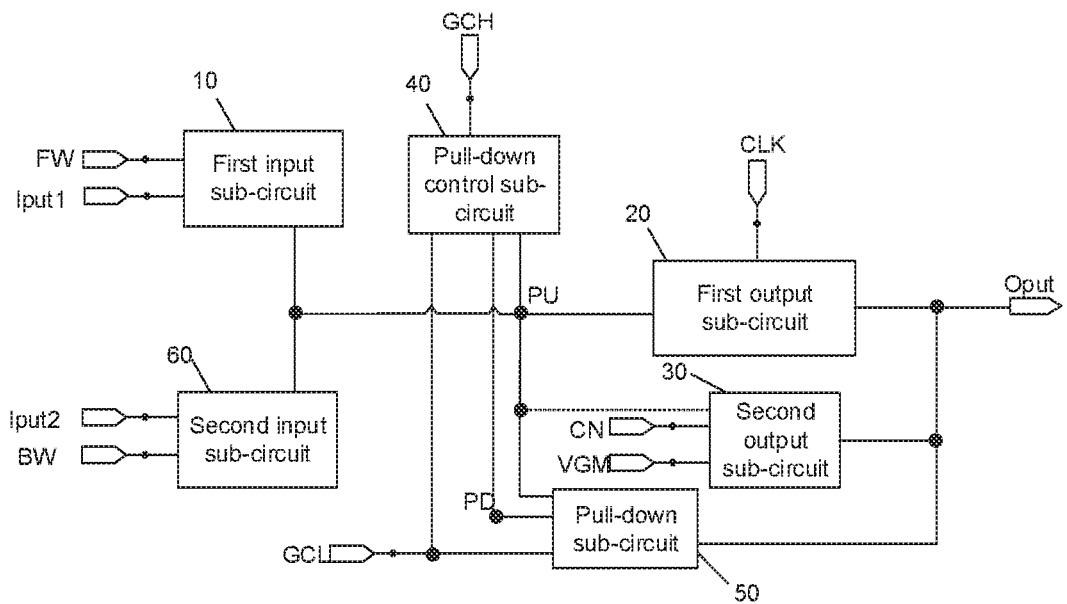
FIG. 8 is a diagram showing sub-circuits of another shift register according to some embodiments of the present disclosure.

On this basis, as shown in FIG. 8, the shift register provided in some embodiments of the present disclosure may further include a pull-down control sub-circuit 40 and a pull-down sub-circuit 50.

The pull-down control sub-circuit 40 is connected to the pull-up node PU, a second voltage terminal GCH, a third voltage terminal GCL, and a pull-down node PD. The pull-down control sub-circuit 40 is configured to output a voltage of the third voltage terminal GCL to the pull-down node PD under control of the pull-up node PU. The pull-down control sub-circuit 40 is further configured to output a voltage of the second voltage terminal GCH to the pull-down node PD under control of the second voltage terminal GCH.

The pull-down sub-circuit 50 is connected to the pull-down node PD, the pull-up node PU, the third voltage terminal GCL, and the output terminal Oput. The pull-down sub-circuit 50 is configured to pull down potentials at the pull-up node PU and the output terminal Oput to the voltage of the third voltage terminal GCL under control of the pull-down node PD.

A circuit structure of the shift register shown in FIG. 8 will be illustrated below with reference to FIG. 9. Details are as follows.

The pull-down control sub-circuit 40 includes a fifth transistor M5, a sixth transistor M6, a seventh transistor M7, and an eighth transistor M8.

The fifth transistor M5 includes a gate, a first electrode, and a second electrode. The gate and the first electrode of the fifth transistor M5 are connected to the second voltage terminal GCH, and the second electrode of the fifth transistor M5 is connected to a first electrode of the seventh transistor M7.

The sixth transistor M6 includes a gate, a first electrode, and a second electrode. The gate of the sixth transistor M6 is connected to the first electrode of the seventh transistor M7 and the second electrode of the fifth transistor M5, the first electrode of the sixth transistor M6 is connected to the second voltage terminal GCH, and the second electrode of the sixth transistor M6 is connected to the pull-down node PD.

The seventh transistor M7 includes a gate, the first electrode, and a second electrode. The gate of the seventh transistor M7 is connected to the pull-up node PU, and the second electrode of the seventh transistor M7 is connected to the third voltage terminal GCL.

The eighth transistor M8 includes a gate, a first electrode, and a second electrode. The gate of the eighth transistor M8 is connected to the pull-up node PU, the first electrode of the eighth transistor M8 is connected to the pull-down node PD, and the second electrode of the eighth transistor M8 is connected to the third voltage terminal GCL.

The pull-down sub-circuit 50 includes a ninth transistor M9 and a tenth transistor M10.

The ninth transistor M9 includes a gate, a first electrode, and a second electrode. The gate of the ninth transistor M9 is connected to the pull-down node PD, the first electrode of the ninth transistor M9 is connected to the pull-up node PU, and the second electrode of the ninth transistor M9 is connected to the third voltage terminal GCL.

The tenth transistor M10 includes a gate, a first electrode, and a second electrode. The gate of the tenth transistor M10 is connected to the pull-down node PD, the first electrode of the tenth transistor M10 is connected to the output terminal Oput, and the second electrode of the tenth transistor M10 is connected to the third voltage terminal GCL.

On this basis, in some embodiments, as shown in FIG. 8, the shift register may further include a second input sub-circuit 60. The second input sub-circuit 60 is connected to a second input terminal INPUT2 (hereinafter and in the drawings indicated by "Iput2"), the pull-up node PU, and a second control terminal BW. The second input sub-circuit 60 is configured to output a voltage of the second control terminal BW to the pull-up node PU under control of a voltage of the second input terminal Iput2.

In some embodiments, as shown in FIG. 9, the second input sub-circuit 60 includes an eleventh transistor M11. The eleventh transistor M11 includes a gate, a first electrode, and a second electrode. The gate of the eleventh transistor M11 is connected to the second input terminal Iput2, the first electrode of the eleventh transistor M11 is connected to the pull-up node PU, and the second electrode of the eleventh transistor M11 is connected to the second control terminal BW.

On this basis, the gate driving circuit including the shift register shown in FIG. 9 may achieve bidirectional scanning to gate lines. In a case where the first control terminal FW outputs a constant high level and the second control terminal BW outputs a constant low level, the gate driving circuit may scan the gate lines in a forward direction. In a case where the first control terminal FW outputs a constant low level and the second control terminal BW outputs a constant high level, the gate driving circuit may scan the gate lines in a reverse direction.

A forward scanning process of the shift register shown in FIG. 9 is described below with reference to the timing control diagram of FIG. 10. When the shift register scans the gate line in the forward direction, FW=1, and BW=0. An image frame includes the following periods.

In the input period P1: Iput1=1, Iput2=0, CLK=0, PU=1, FW=1, CN=0, PD=0, and Oput=0.

In the input period P1, since the first input terminal Iput1 outputs a high level, the third transistor M3 is turned on, and transmits the high level of the first control terminal FW to the pull-up node PU to charge the first capacitor C1. Under control of the high level of the second voltage terminal GCH, the fifth transistor M5 and the sixth transistor M6 are turned on. Under control of the voltage of the pull-up node PU, the seventh transistor M7 and the eighth transistor M8 are turned on. By setting a size ratio of the sixth transistor M6 and a size ratio of the eighth transistor M8, for example, by setting the width-to-length ratio of the eighth transistor M8 to be greater than the width-to-length ratio of the sixth transistor M6, the voltage of the third voltage terminal GCL is output to the pull-down node PD through the eighth transistor M8, which may be possible to ensure that the pull-down node PD is at a low level. Under control of the pull-down node PD, the ninth transistor M9 and the tenth transistor M10 are turned off. Since the second input terminal Iput2 outputs a low level, the eleventh transistor M11 is turned off. Under control of the second output control terminal ON, the first transistor M1 is turned off.

In addition, under control of the voltage of the pull-up node PU, the fourth transistor M4 is turned on, and transmits the low level of the clock signal terminal CLK to the output terminal Oput, so that the output terminal Oput does not output a gate scanning signal during the input period P1.

In the first output period P2: Iput1=0, Iput2=0, CLK=1, PU=1, FW=1, CN=0, PD=0, and Oput=1.

In the first output period P2, since the first input terminal Iput1 outputs a low level, the third transistor M3 is turned off. The first capacitor C1 charges the pull-up node PU by using the high level stored in the input period P1, so that the fourth transistor M4 remains in the turned-on state. In this case, the high level of the clock signal terminal CLK is output as a gate scanning signal to the output terminal Oput through the fourth transistor M4, so as to scan the gate line connected to the output terminal Oput.

In addition, in the first output period P2, the potential at the pull-up node PU is further increased under a bootstrap action of the first capacitor C1. Under control of the voltage of the second output control terminal ON, the first transistor M1 is turned off.

In addition, the states of other transistors in the first output period P2 are the same as that in the input period P1, and details are not described herein again.

In the second output period P3: Iput1=0, Iput2=0, CLK=1, PU=1, FW=ON=1, PD=0, and Oput=VGM.

Same as in the first output period P2, the high level VGH (first level) of the clock signal terminal CLK is output to the output terminal Oput through the fourth transistor M4. Under control of the voltage of the second output control terminal CN, the first transistor M1 is turned on. By controlling a size ratio of the fourth transistor M4 and a size ratio of the first transistor M1, the first transistor M1 transmits the voltage of the first voltage terminal VGM to the output terminal Oput, which may be possible to ensure that the output voltage of the output terminal Oput in this period is the voltage of the first voltage terminal VGM.

In some embodiments, in a case where the shift register includes the second transistor M2, in the second output period P3, under control of the voltage of the second output control terminal ON, the second transistor M2 is turned on, and transmits the voltage of the first voltage terminal VGM to the pull-up node PU. Therefore, the fourth transistor M4 may not be fully turned on, and the high level of the clock signal terminal CLK may not be fully transmitted to the output terminal Oput through the fourth transistor M4. As a result, it may be further ensured that the output voltage of the output terminal Oput is the voltage of the first voltage terminal VGM.

Figure 10:
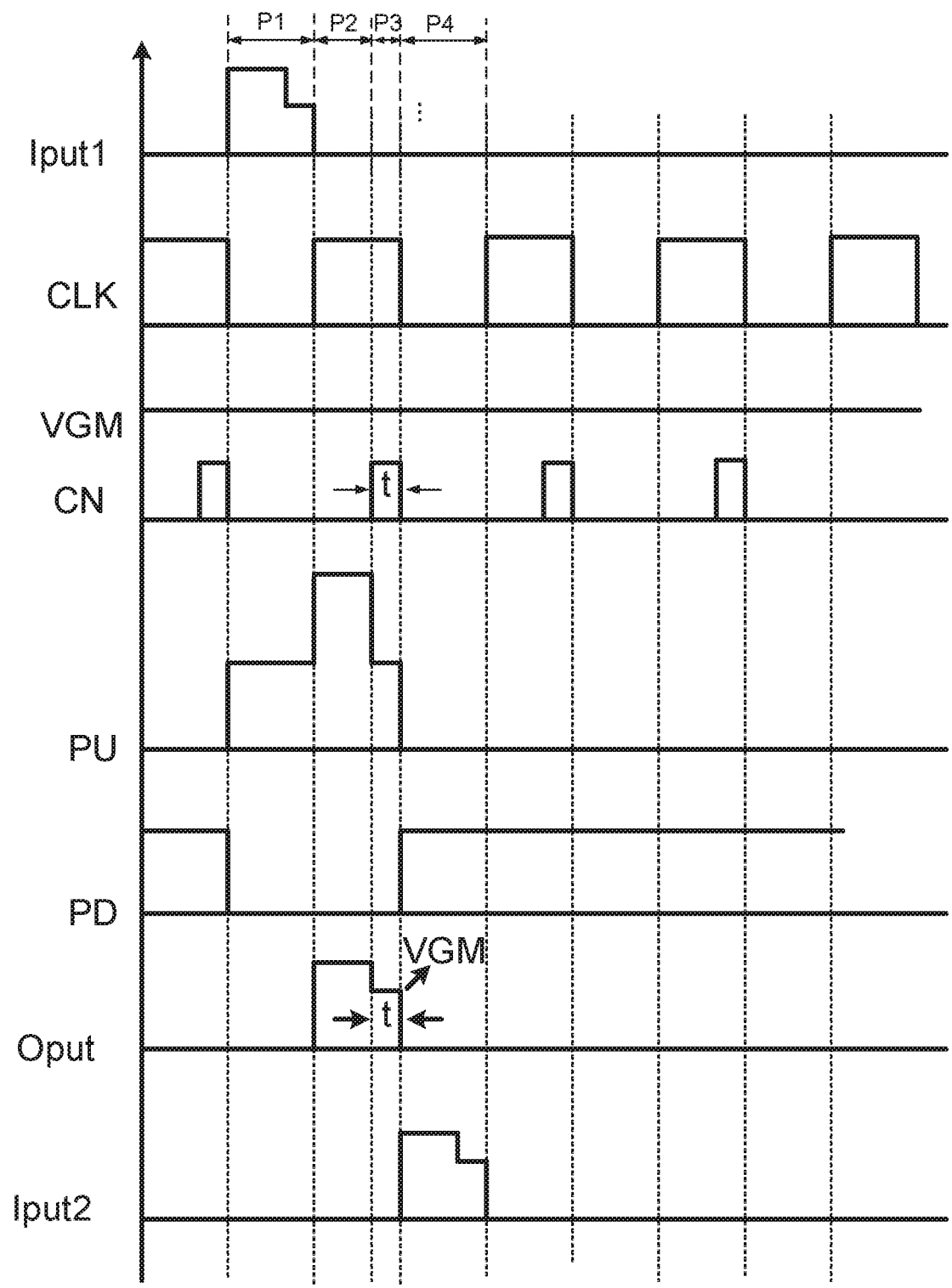
FIG. 10 is a timing control diagram of the shift register shown in FIG. 9.

It will be noted that, referring to FIG. 10, in some embodiments of the present disclosure, a specific duration t of the second output period P3 is not limited. The duration t may be determined according to actual needs without affecting a normal output of gate scanning signals of the shift register. For example, in some embodiments, the duration t may be set according to specific situations of the RC delay.

In the reset period P4: Iput1=0, Iput2=1, CLK=0, PU=0, FW=1, CN=0, PD=1, and Oput=0.

In the reset period P4, since the second input terminal Iput2 outputs a high level, the eleventh transistor M11 is turned on, and transmits the low level of the second control terminal BW to the pull-up node PU. Under control of the voltage of the pull-up node PU, the fourth transistor M4, the seventh transistor M7, and the eighth transistor M8 are turned off. The high level of the second voltage terminal GCH is output to the pull-down node PD through the sixth transistor M6. Under control of the voltage of the pull-down node PD, the ninth transistor M9 and the tenth transistor M10 are turned on. A potential at the pull-up node PU is further pulled down to the low level of the third voltage terminal GCL through the ninth transistor M9, and a potential at the output terminal Oput is pulled down to the low level of the third voltage terminal GCL through the tenth transistor M10.

In addition, in the reset period P4, the third transistor M3, the first transistor M1, and the second transistor M2 are turned off.

Then, before a next image frame arrives, Iput2=0, and the eleventh transistor M11 is turned off. Under control of the voltage of the pull-down node PD, the potentials at the pull-up node PU and at the output terminal Oput are pulled down to the low level of the third voltage terminal GCL through the ninth transistor M9 and the tenth transistor M10 respectively, and the pull-up node PU and the output terminal Oput remain at the low level.

It will be noted that, in a case where the shift register scans the gate line in the reverse direction, FW=0, and BW=1. The working principle of the shift register herein is the same as that when it scans the gate line in the forward direction, and details are not described again in embodiments of the present disclosure.

Figure 11:
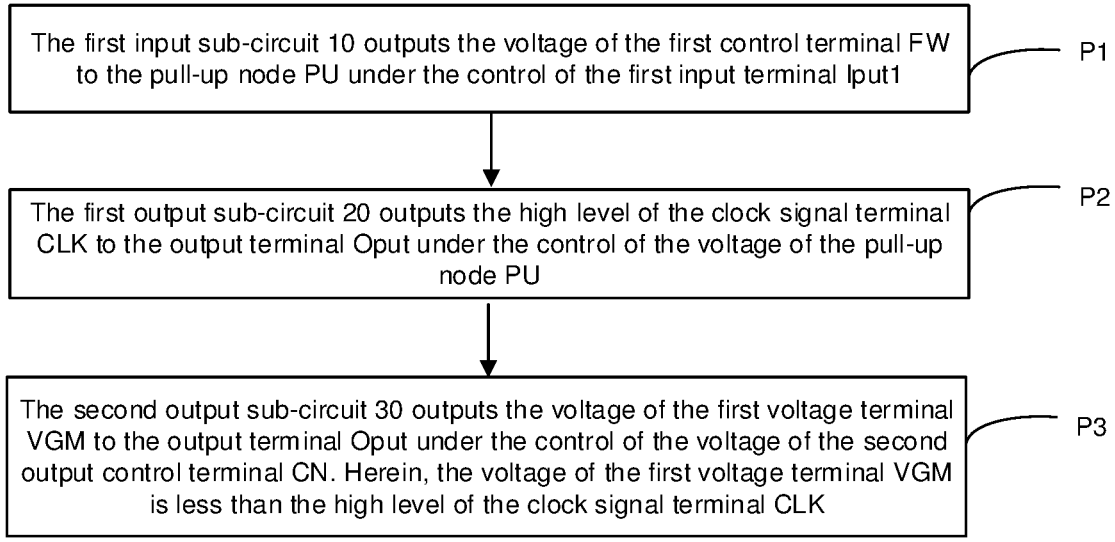
FIG. 11 is a flowchart of a driving method for a shift register according to some embodiments of the present disclosure.

Some embodiments of the present disclosure provide a driving method for any one of the shift registers as described above. In an image frame, as shown in FIG. 11, the driving method includes the following steps.

In the input period P1, the first input sub-circuit 10 outputs the voltage of the first control terminal FW to the pull-up node PU under control of the first input terminal Iput1.

In the first output period P2, the first output sub-circuit 20 outputs the high level (first level) of the clock signal terminal CLK to the output terminal Oput under control of the voltage of the pull-up node PU.

In the second output period P3, the second output sub-circuit 30 outputs the voltage of the first voltage terminal VGM to the output terminal Oput under control of the voltage of the second output control terminal ON. The voltage of the first voltage terminal VGM is less than the first level of the clock signal terminal CLK (that is, the absolute value of the voltage of the first voltage terminal is less than the absolute value of the first level of the clock signal terminal).

In some embodiments, in a case where the shift register includes the pull-down control sub-circuit 40 and the pull-down sub-circuit 50, in the input period, the driving method further includes the step. The pull-down control sub-circuit 40 outputs the voltage of the third voltage terminal GCL to the pull-down node PD under control of the voltage of the pull-up node PU.

Figure 12:
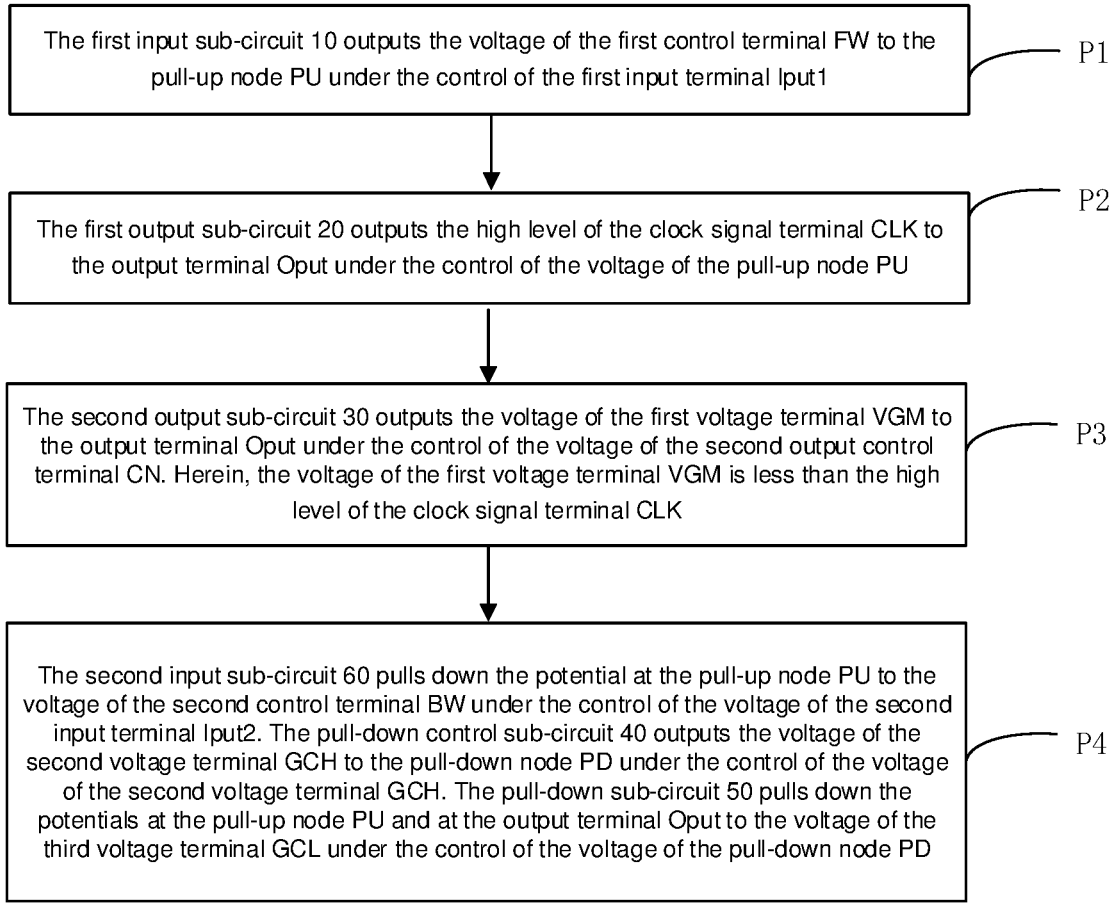
FIG. 12 is a flowchart of a driving method for a shift register according to some embodiments of the present disclosure.

On this basis, as shown in FIG. 12, the driving method further includes a reset period P4 after the second output period P3. In the reset period P4, the second input sub-circuit 60 pulls down the potential at the pull-up node PU to the voltage of the second control terminal BW under control of the voltage of the second input terminal Iput2; the pull-down control sub-circuit 40 outputs the voltage of the second voltage terminal GCH to the pull-down node PD under control of the voltage of the second voltage terminal GCH; and the pull-down sub-circuit 50 pulls down the potentials at the pull-up node PU and at the output terminal Oput to the voltage of the third voltage terminal GCL under control of the voltage of the pull-down node PD.

It will be noted that, since the working processes of the shift register in the above periods have been described in detail above, details will not be repeated here.

Figure 13:
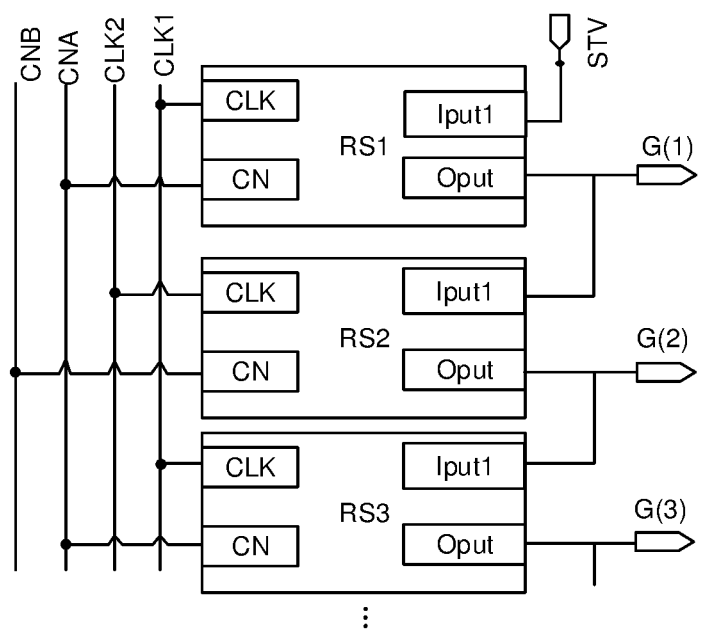
FIG. 13 is a schematic structural diagram of a gate driving circuit according to some embodiments of the present disclosure.

Some embodiments of the present disclosure provide a gate driving circuit. As shown in FIG. 13, the gate driving circuit includes a plurality of shift registers (for example, a first-stage shift register RS1, a second-stage shift register RS2, etc.) connected in cascade, each of which is any one of the shift registers described above, Details are as follows.

A first input terminal Iput1 of a first-stage shift register RS1 is connected to a start signal terminal STV, and a first input terminal Iput1 of a shift register in each stage except for the first-stage shift register RS1 is connected to an output terminal Oput of a previous-stage shift register.

It will be noted that, a clock signal CLK1 and a clock signal CLK2 which are complementary to each other are respectively input to clock signal terminals CLK of two adjacent stages of shift registers, and the clock signal CLK1 and clock signal CLK2 are each input to a respective stage of shift register every other stage of shift register. Signals CNA and CNB respectively input to second output control terminals CN of two adjacent stages of shift registers have a same frequency and opposite phases, and are complementary to each other. Valid periods of the high levels of the second output control terminals CN of two adjacent stages of shift registers are the same, and valid periods of the high levels of the clock signal terminals CLK of two adjacent stages of shift registers are the same.

On this basis, in the gate driving circuit provided in some embodiments of the present disclosure, each stage of shift register outputs the high level VGH of the clock signal terminal CLK to the output terminal Oput under control of the voltage of the pull-up node PU in the first output period, and outputs the voltage of the first voltage terminal VGM to the output terminal Oput under control of the voltage of the second output control terminal ON in the second output period. The voltage of the first voltage terminal VGM is less than the high level of the clock signal terminal. Therefore, in a process of driving the gate line by the shift register, during transformation between high and low levels, the amount of change of the gate line driving voltage at the proximal end is: $\Delta Vg1 = V_{GL} - V_{GM}$; and as for an existing shift register, the amount of change of gate line driving voltage at the proximal end is: $\Delta Vg1' = V_{GL} - V_{GM}$. Since the voltage of the first voltage terminal VGM is less than the high level VGH of the clock signal terminal CLK, $\Delta Vg1 < \Delta g1'$. On this basis, in this embodiment, by reducing the difference between the amount of change $\Delta Vg1$ of the gate line driving voltage at the proximal end and the amount of change $\Delta Vg2$ of the gate line driving voltage at the distal end, the difference between the feedthrough voltage $\Delta Vp1$ at the proximal end and the feedthrough voltage $\Delta Vp2$ at the distal end may be reduced. Therefore, the common voltage Vcom may be individually adjusted to a certain value, so that data voltages Vdate at the proximal end and at the distal end may be symmetric about the common voltage Vcom.

Figure 14:
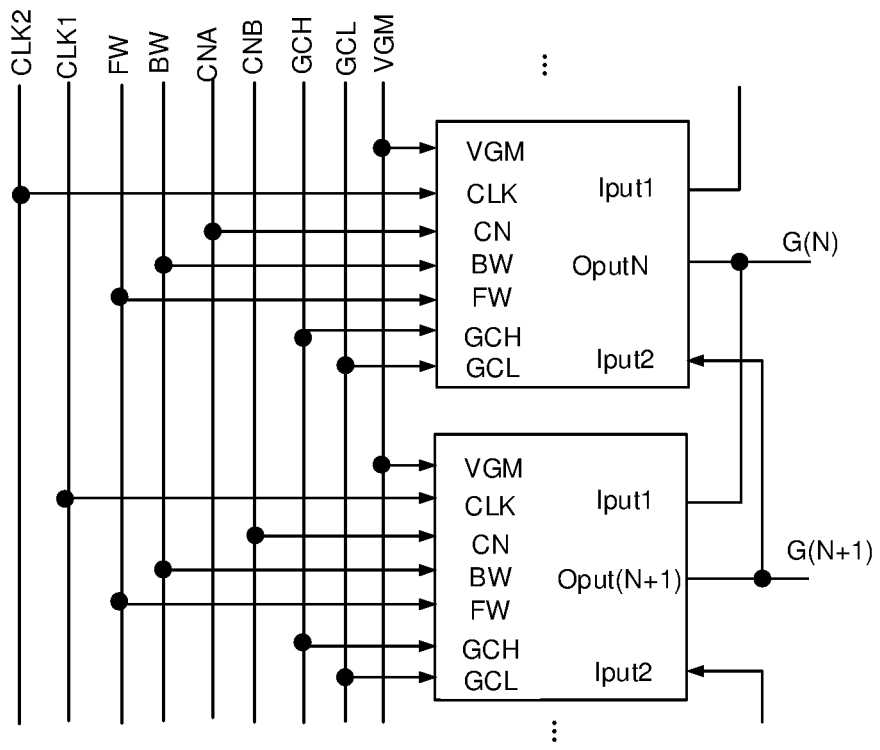
FIG. 14 is a schematic structural diagram of another gate driving circuit according to some embodiments of the present disclosure.

On this basis, in a case where the gate driving circuit includes the second input sub-circuit 60, as shown in FIG. 14, a second input terminal Iput2 of a shift register in each stage except for a last-stage shift register is connected to an output terminal Oput of a next-stage shift register, and a second input terminal Iput2 of the last-stage shift register is connected to a second signal terminal. In this case, the gate driving circuit may achieve both forward scanning and reverse scanning to the gate lines.

Figure 15:
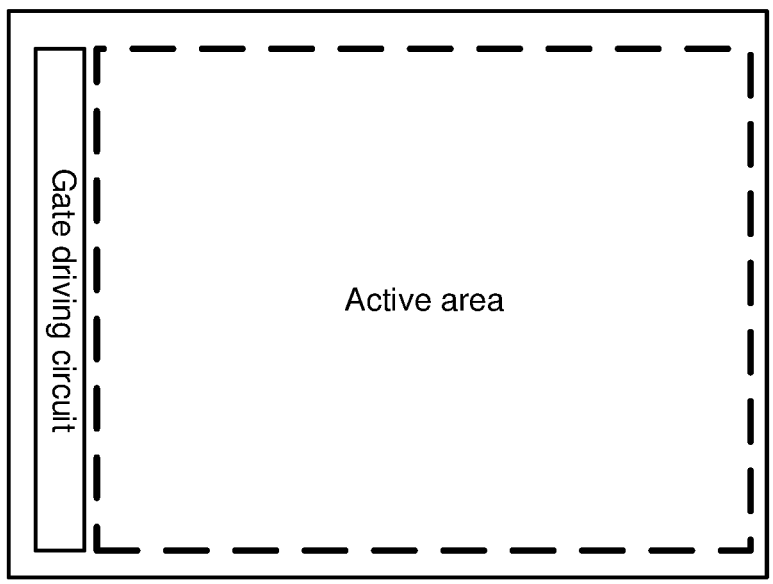
FIG. 15 is a schematic structural diagram of a display device according to some embodiments of the present disclosure.

As shown in FIG. 15, some embodiments of the present disclosure provide a display device, which includes the gate driving circuit shown in FIG. 13 or FIG. 14. The gate driving circuit in the display device has the same structure and beneficial effects as the gate driving circuit provided in the foregoing embodiments. Since a structure and beneficial effects of the gate driving circuit have been described in detail in the foregoing embodiments, details are not described herein again.

It will be noted that, the display devices may include at least a LCD device and an organic light-emitting diode (OLEO) display device. For example, the display device may be any product or component having a display function, such as a LCD, a LCD TV, a digital photo frame, a mobile phone, or a tablet computer.

The foregoing descriptions are merely some implementation manners of the present disclosure, but the protection scope of the present disclosure is not limited thereto. Any person skilled in the art could readily conceive of changes or replacements within the technical scope disclosed by the present disclosure, which shall all be included in the protection scope of the present disclosure. Therefore, the protection scope of the present disclosure shall be subject to the protection scope of the claims.

What is claimed is:

1. A shift register, comprising a first input sub-circuit, a first output sub-circuit, a second output sub-circuit, a pull-down control sub-circuit and a pull-down sub-circuit, wherein
   the first input sub-circuit is connected to a first input terminal, a pull-up node, and a first control terminal, and the first input sub-circuit is configured to output a voltage of the first control terminal to the pull-up node under control of a voltage of the first input terminal;
   the first output sub-circuit is connected to the pull-up node, a clock signal terminal, and an output terminal, and the first output sub-circuit is configured to output a first level of the clock signal terminal to the output terminal under control of a voltage of the pull-up node;
   the second output sub-circuit is connected to the output terminal, a second output control terminal, and a first voltage terminal, and the second output sub-circuit is configured to output a voltage of the first voltage terminal to the output terminal under control of a voltage of the second output control terminal;
   the pull-down control sub-circuit is connected to the pull-up node, a second voltage terminal, a third voltage terminal, and a pull-down node; the pull-down control sub-circuit is configured to output a voltage of the third voltage terminal to the pull-down node under control of the voltage of the pull-up node; and the pull-down control sub-circuit is further configured to output a voltage of the second voltage terminal to the pull-down node under control of the voltage of the second voltage terminal;
   the pull-down sub-circuit is connected to the pull-down node, the pull-up node, the third voltage terminal, and the output terminal; and the pull-down sub-circuit is configured to pull down potentials at the pull-up node and at the output terminal to the voltage of the third voltage terminal under control of a voltage of the pull-down node;
   wherein the pull-down control sub-circuit includes a fifth transistor, a sixth transistor, a seventh transistor and an eighth transistor; and
   a gate electrode and a first electrode of the fifth transistor is connected to the second voltage terminal, and a second electrode of the fifth transistor is connected to a first electrode of the seventh transistor; a gate electrode of the sixth transistor is connected to the pull-up node, a first electrode of the sixth transistor is connected to the second voltage terminal, and a second electrode of the sixth transistor is connected to the pull-down node; a gate electrode of the seventh transistor is connected to the pull-up node, and a second electrode of the seventh transistor is connected to the third voltage terminal; a gate electrode of the eighth transistor is connected to the pull-up node, a first electrode of the eighth transistor is connected to the pull-down node, and a second electrode of the eighth transistor is connected to the third voltage terminal.

2. The shift register according to claim 1, wherein the second output sub-circuit includes a first transistor;
a gate electrode of the first transistor is connected to the second output control terminal, a first electrode of the first transistor is connected to the output terminal, and a second electrode of the first transistor is connected to the first voltage terminal.

3. The shift register according to claim 2, wherein the second output sub-circuit is further connected to the pull-up node;
the second output sub-circuit further includes a second transistor; a gate electrode of the second transistor is connected to the second output control terminal, a first electrode of the second transistor is connected to the pull-up node, and a second electrode of the second transistor is connected to the first voltage terminal.

4. The shift register according to claim 1, wherein the first input sub-circuit includes a third transistor;
a gate electrode of the third transistor is connected to the first input terminal, a first electrode of the third transistor is connected to the first control terminal, and a second electrode of the third transistor is connected to the pull-up node.

5. The shift register according to claim 1, wherein the first output sub-circuit includes a fourth transistor and a first capacitor;
a gate electrode of the fourth transistor is connected to the pull-up node, a first electrode of the fourth transistor is connected to the clock signal terminal, and a second electrode of the fourth transistor is connected to the output terminal; a first electrode of the first capacitor is connected to the pull-up node, and a second electrode of the first capacitor is connected to the output terminal; and
a width-to-length ratio of the first transistor is greater than a width-to-length ratio of the fourth transistor.

6. The shift register according to claim 1, the shift register further comprising a second input sub-circuit;

the second input sub-circuit is connected to a second input terminal, the pull-up node, and a second control terminal; and the second input sub-circuit is configured to output a voltage of the second control terminal to the pull-up node under control of a voltage of the second input terminal.

7. The shift register according to claim 6, wherein the second input sub-circuit includes an eleventh transistor; and
a gate electrode of the eleventh transistor is connected to the second input terminal, a first electrode of the eleventh transistor is connected to the pull-up node, and a second electrode of the eleventh transistor is connected to the second control terminal.

8. The shift register according to claim 1, wherein the pull-down sub-circuit includes a ninth transistor and a tenth transistor; and
a gate electrode of the ninth transistor is connected to the pull-down node, a first electrode of the ninth transistor is connected to the pull-up node, and a second electrode of the ninth transistor is connected to the third voltage terminal; a gate electrode of the tenth transistor is connected to the pull-down node, a first electrode of the tenth transistor is connected to the output terminal, and a second electrode of the tenth transistor is connected to the third voltage terminal.

9. The shift register according to claim 1, wherein an absolute value of the voltage of the first voltage terminal is less than an absolute value of the first level of the clock signal terminal.

10. A gate driving circuit, comprising a plurality of shift registers according to claim 1 connected in cascade, wherein
a first input terminal of a first-stage shift register is connected to a start signal terminal; and
an output terminal of a previous-stage shift register except for the first-stage shift register is connected to a first input terminal of a next-stage shift register.

11. The gate driving circuit according to claim 10, wherein each shift register includes a second input sub-circuit,
a second input terminal of a shift register in each stage except for a last-stage shift register is connected to an output terminal of a next-stage shift register; and
a second input terminal of the last-stage shift register is connected to a second signal terminal.

12. A display device, comprising the gate driving circuit according to claim 10.

* * * * *